(12) United States Patent
Harada et al.

(10) Patent No.: US 6,870,189 B1
(45) Date of Patent: Mar. 22, 2005

(54) PINCH-OFF TYPE VERTICAL JUNCTION FIELD EFFECT TRANSISTOR AND METHOD OF MANUFACTURING THE SAME

(75) Inventors: Shin Harada, Osaka (JP); Kenichi Hirotsu, Osaka (JP); Hiroyuki Matsunami, Yawata (JP); Tsunenobu Kimoto, Kyoto (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/168,265
(22) PCT Filed: Sep. 11, 2000
(86) PCT No.: PCT/JP00/06211

§ 371 (c)(1),
(2), (4) Date: Jun. 19, 2002

(87) PCT Pub. No.: WO01/48809
    PCT Pub. Date: Jul. 5, 2001

(30) Foreign Application Priority Data

Dec. 24, 1999 (JP) .............................. 11/366799
Jan. 18, 2000 (JP) ........................... 2000/008969
Jun. 28, 2000 (JP) ........................... 2000/194464

(51) Int. Cl.$^7$ .................... H01L 31/0312; H01L 29/80; H01L 31/112
(52) U.S. Cl. ................... 257/77; 257/263; 257/264; 257/266; 257/268; 257/269; 257/285; 257/287
(58) Field of Search ............................... 257/256, 263, 257/264, 266, 268, 269, 285, 286, 287, 77

(56) References Cited

U.S. PATENT DOCUMENTS 5,391,897 A    2/1995  Nonaka
5,396,085 A  * 3/1995  Baliga ........................... 257/77
6,313,482 B1 * 11/2001 Baliga ........................... 257/77

FOREIGN PATENT DOCUMENTS

JP    53078177   7/1978
JP    04273169   9/1992

OTHER PUBLICATIONS

Mitlehner et al., Article Entitled: "Dynamic characteristics of high voltage 4H–SiC vertical JFETs."; 1999 IEEE; pp. 339–342.

* cited by examiner

*Primary Examiner*—Steven Loke
(74) *Attorney, Agent, or Firm*—W. F. Fasse; W. G. Fasse

(57) ABSTRACT

A junction field effect transistor (JFET) is provided that is capable of a high voltage resistance, high current switching operation, that operates with a low loss, and that has little variation. This JFET is provided with a gate region (2) of a second conductivity type provided on a surface of a semiconductor substrate, a source region (1) of a first conductivity type, a channel region (10) of the first conductivity type that adjoins the source region, a confining region (5) of the second conductivity type that adjoins the gate region and confines the channel region, a drain region (3) of the first conductivity type provided on a reverse face, and a drift region (4) of the first conductivity type that continuously lies in a direction of thickness of the substrate from a channel to a drain. A concentration of an impurity of the first conductivity type in the drift region and the channel region is lower than a concentration of an impurity of the first conductivity type in the source region and the drain region and a concentration of an impurity of the second conductivity type in the confining region.

19 Claims, 12 Drawing Sheets

PINCH-OFF TYPE VERTICAL JUNCTION FIELD EFFECT TRANSISTOR AND METHOD OF MANUFACTURING THE SAME

This application is a national phase of PCT/JP00/06211 filed on Sep. 11, 2000, under 35 U.S.C. § 371.

TECHNICAL FIELD

The present invention relates to a junction field effect transistor (JFET) that performs a high current, high voltage switching operation used in a direct current/alternating current conversion in power transmission and in an inverter and the like, and more specifically, to a vertical JFET that achieves further reduction in the power loss.

BACKGROUND ART

A junction field effect transistor (JFET) used for switching of an inverter and the like is required to endure high current and high voltage. FIG. 25 is a diagram representing a normal horizontal JFET. In the horizontal JFET, carriers move substantially parallel to the semiconductor substrate surface. A ground potential is applied to a source region 101 through a source electrode 111, and a positive potential is applied to a drain region 103 through a drain electrode 113. A pn junction is formed below a gate region 102 beneath gate electrode 112, and when the device is caused to attain an off-state, a negative voltage is applied to gate electrode 112 such that this junction portion attains the reverse bias state. When the device is in an on-state, electrons in source region 101 are attracted by the positive potential of drain region 103, pass through a channel region 110 under gate region 102, and reach drain region 103.

In the above-described horizontal JFET, the source electrode, the gate electrode, and the drain electrode are located in the same plane as shown in FIG. 25 so that the drain electrode and other electrodes would be close with air existing therebetween. Since breakdown electric field of air is 3 kV/mm at most, there was a need to place the drain electrode away from other electrodes by at least 1 mm when a voltage of 3 kV or greater was applied between the drain electrode and other electrodes in the off-state in which no current flowed. Consequently, the length of a channel region 109 leading from source region 101 to drain region 103 became long, and only a small current could be allowed to flow, so that a high current required for a so-called power transistor could not be allowed to flow.

FIG. 26 is a diagram representing a vertical JFET, also called a static induction transistor (hereinafter, referred to as an SIT), that is proposed and practically utilized so as to provide improvement upon the weakness of the above-described horizontal JFET. Unlike the horizontal JFET, the carriers move substantially in the direction of thickness of the semiconductor substrate in the vertical JFET. In an SIT, a plurality of gate regions 102 are formed as $p^+$ regions in which p type impurity of high concentration is implanted, and $n^-$ region having n type impurity of low concentration added is formed therearound. Since the n type impurity concentration in the $n^-$ region is low, a depletion layer expands at all times and the channel region is vanished. As a result, the saturation phenomenon of a drain current due to a pinch-off that occurs in the above-described horizontal JFET does not take place. The method of potential application to each of the source region, the gate region, and the drain region is the same as that of the horizontal JFET shown in FIG. 25. The electrons in source region 101 overcome the potential barrier of the gate region, are attracted to the drain potential, and drift in the depletion layer. When the drain potential is set to a high positive potential, the potential barrier against the electrons of the gate region becomes small, which allows an increase in a drift current. Thus, the saturation phenomenon of the drain current would not take place even when the drain potential is raised. The drain current is normally controlled by a gate potential and a drain potential. When the above-described SIT is utilized for switching, in order to obtain a large current, the voltage had to be set high so as to allow the electrons to overcome the potential barrier, which inevitably resulted in a certain loss, though small.

Moreover, when a JFET was caused to attain the off-state in the switching operation, there was a need to apply a negative voltage whose absolute value exceeded 10V to a gate electrode in order to pinch off the channel region with the depletion layer. Since the application of such negative voltage having a large absolute value causes power loss also in the off-state, it is desirable to realize the off-state without any power loss.

Furthermore, in general, the impurity concentration of a channel region in a JFET is subjected to restrictions in order to ensure a prescribed transistor characteristic, so that it cannot be set too high. Consequently, the electric resistance of the channel region tends to increase, and what is more, the electric resistance varies according to the impurity concentration, the thickness of the channel region, and so on. The transistor characteristic is strongly influenced by the electric resistance of the above-described channel region so that it varies significantly according to the variations in the impurity concentration, the thickness and the like. If, in order to avoid such variations at each devices, an impurity element of a high concentration is implanted for the purpose of reducing the electric resistance in the channel region, the withstand voltage performance would be degraded. Thus, there was a demand for a JFET that has the reduced on-resistance without the use of an impurity of a high concentration and that is less likely to be affected by variations in the impurity concentration of the channel region, the thickness of the channel region, and so on.

DISCLOSURE OF THE INVENTION

An object of the present invention is to provide a JFET that is capable of a high withstand voltage, high current switching operation and that operates with a low loss. Moreover, another object of the present invention is to provide as a power switching device a power semiconductor device that is capable of reducing the voltage required to cause the off-state in order to realize an even lower loss. In addition, a further object of the present invention is to provide a JFET that has a superior withstand voltage performance and a low on-resistance and that is less likely to be affected by variations in the impurity concentration and the thickness of the channel region, and so on.

A JFET according to the present invention is provided with a gate region of a second conductivity type provided on one main surface of a semiconductor thin body, a source region of a first conductivity type provided on the one main surface side, a channel region of the first conductivity type that adjoins the source region, and a confining region of the second conductivity type that adjoins the gate region and confines a range of the channel region. The JFET is further provided with a drain region of the first conductivity type provided on the other main surface of the semiconductor thin body, and a drift region of the first conductivity type that continuously lies in a direction of thickness of the semiconductor thin body from the channel region to the drain region. In this JFET, a concentration of an impurity of the first conductivity type in the drift region and the channel region is lower than a concentration of an impurity of the first conductivity type in the source region and the drain region and a concentration of an impurity of the second conductivity type in the confining region.

According to this arrangement, in the off-state, a reverse bias voltage can be applied to the gate region to form a depletion layer from the confining region toward the channel region so as to block the flow of carriers that passes from the source region via the channel region and the drift region toward the drain region. Moreover, application of a high voltage to the drain region in the off-state results in application of a high reverse bias voltage to an interface between the confining region and the drift region so that a depletion layer is formed from the confining region to the drift region. At this time, this depletion layer interposed between the drain region and the gate region withstands the voltage so that the withstand voltage performance between the drain region and the gate region can be improved. In addition, in the on-state, the source region and the gate region are brought to about the same potential so as not to allow the formation of the depletion layer, while allowing carriers to move from the source region via the channel region and the drift region to the drain region. The amount of carrier movement, or the current, is controlled by the drain potential. As the drain potential is raised, it becomes a pinch-off potential, and the depletion layer begins to expand from the interface between the confining region and the drift region toward the drift region, whereby the drain current becomes saturated. Such an operation is essentially different from the operation of a conventional vertical JFET (SIT) in which there is no pinch-off and saturation of the drain current does not occur. The improvement of the withstand voltage performance due to the depletion layer withstanding the voltage in the off-state described above, the saturation phenomenon of the drain current in the on-state in a case where a current flows in the direction of thickness of the substrate, i.e., vertically, and so on are operations that have only become possible with the JFET of the present invention. By the saturation of the drain current described above, the burnout of the JFET itself and the surrounding elements can be prevented. It is to be noted that there is nothing to prevent the flow of the carriers in a path leading from the source region to the drain region in the on-state, which achieves an extremely low on-resistance. Thus, the power consumption can be further reduced when compared with the conventional SIT and the like in which the carriers are forced to pass through the potential barrier in the depletion layer.

Moreover, here, in the case where the first conductivity type impurity and the second conductivity type impurity are included, the impurity concentration would indicate, unless otherwise noted, the concentration of the dominant impurity that remains after the impurities cancel one another out.

In addition, in the above-described JFET of the present invention, the gate electrode making contact with the gate region preferably forms an ohmic contact with the gate region. With the ohmic contact, it becomes possible to project a depletion layer from the confining region toward the channel region in the interface between confining region and channel region forming a pn junction to realize the off-state with high controllability by the application of a reverse bias voltage to the gate electrode. Since the second conductivity type impurity concentration of the gate region is high, it is easy to provide the ohmic contact.

According to the above-described JFET of the present invention, where the simplicity of the structure becomes important, the confining region preferably confines and encloses the gate region from an inner side of the semiconductor thin body, for instance.

With this arrangement, since the confining region is formed such that it confines and encloses the gate region from an inner side, the arrangement is simplified and the number of mask forming steps during manufacture is reduced so that the manufacture is facilitated, thereby improved yield is achieved. In addition, the gate region contains an impurity element of the same conductivity type as that of the confining region, and a depletion layer can be projected from the confining region toward the channel region to realize the off-state. Moreover, in this off-state, when a high voltage is applied to the drain region, a high reverse bias voltage would be applied to the interface between the confining region and the drift region, and the depletion layer is formed from the confining region to the drift region and withstands the voltage between the drain and the gate so that the withstand voltage performance can be improved.

In the above-described JFET according to the present invention, the gate region coincides with the confining region.

When the confining region is confined in the vicinity of a surface of the substrate, there is no need to distinguish the confining region from the gate region either in spatial dimensions or in impurity concentration, and they coincide. In such an arrangement, the structure is simple so that the manufacture is facilitated. Moreover, the term "gate region" may refer to a region of the second conductivity type formed in a position deep into the direction of thickness of the semiconductor thin body which surpasses the range of the gate region in the usual sense of the term, that is, a semiconductor region of the second conductivity type with which a gate electrode makes ohmic contact. When the range of the gate region is thus spread, the confining region and the gate region always coincide. In the present description, however, the region that encloses and confines the channel region will be referred to as the confining region regardless of the position being deep or shallow in the semiconductor thin body. The term gate region will be used in the usual sense of the term to mean the region in a vicinity below the gate electrode where the gate electrode makes ohmic contact.

In the above-described JFET according to the present invention, the source region is preferably formed protruding from one main surface and the channel region is formed beneath the source region in a continuous manner.

With this arrangement, the mask utilized for patterning of the source region using dry etching can be also utilized for the implantation of a second conductivity type impurity element into the gate region and the confining region enclosing the gate region. As a result, the number of masking steps can be reduced and the mask alignment is facilitated, so that improvement in the yield can be achieved.

In the above-described JFET according to the present invention, the gate region is formed of two regions, these two gate regions are respectively confined and enclosed by the confining regions, and the channel region is disposed in contact with and between these two confining regions.

With this arrangement, the structure of the JFET becomes even simpler and the mask alignment is facilitated, which contributes to the effect of reduction in the number of manufacturing steps as well as to the improvement in the yield.

In the above-described JFET according to the present invention, a width of the channel region enclosed by the confining region is smaller than a thickness of a depletion layer due to a built-in potential in a junction portion between the confining region and the channel region.

Normally, a JFET attains the on-state when no voltage is applied to the gate electrode and attains the off-state when a negative potential of which absolute value exceeds 10V is applied to the gate electrode. In other words, a JFET commonly performs a normally-on operation. When the JFET of the normally-on type is used for the control of a motor and the like, since the on-state is attained when no voltage is applied to the gate electrode, the motor would remain in rotation in the case of a gate failure, which is dangerous. Consequently, when the JFET of the normally-on type is used for the control of the motor and the like, in preparation for an instance of failure, there is a need to provide a mechanism to a gate circuit to turn itself off when it fails, which complicates the gate circuit arrangement. Moreover, power consumption takes place even during the off period since there is a need to continue the application of a negative voltage in the off-state.

With the above-described arrangement, the JFET of the present invention becomes a normally-off type. In other words, the off-state is realized when no voltage is applied to a gate, and the on-state is attained when a relatively low positive potential is applied to the gate. By utilizing this normally-off type JFET, the control of the motor and the like can be performed without providing the gate circuit with a mechanism to remedy the failure. Moreover, power consumption does not take place during the off period.

In the above-described JFET according to the present invention, a first conductivity type impurity concentration of the drift region is preferably higher than a first conductivity type impurity concentration of the channel region.

With this concentration arrangement, when the off-state is to be attained, a reverse bias voltage can be applied to the gate electrode to ensure the projection of the depletion layer toward the channel region. Thus, the off-state can be realized with certainty and with high speed. When the on-state is to be attained, the depletion layer can be vanished in a short period of time so that a high-speed switching becomes possible. In addition, the first conductivity type impurity concentration of the drift region is lower than the second conductivity type impurity concentration of the confining region, so that a depletion layer is also formed in the drift region along with increase in the reverse bias voltage, and this depletion layer contributes to withstand voltage, thereby achieving higher withstand voltage performance. When the drain voltage is raised in the on-state, the depletion layer expands from the confining region toward the drift region, causing a pinch-off, and the drain current is saturated so that problems such as burnout can be prevented.

In the above-described JFET according to the present invention, an interposed region of the second conductivity type is provided that makes contact with a source electrode located on the source region and that passes through the source region and stretches out to the channel region.

With this structure, an electric field within the channel region directed from a portion of the confining region close to the source region toward the source region can be increased. Consequently, the depletion layer that expands from the interface between the confining region and channel region toward the channel region readily spreads toward the source region. As a result, the off-state can be realized without applying a large negative voltage between the source and the gate so that it becomes possible to achieve an even lower loss as a power switching device.

In the above-described JFET according to the present invention, the interposed region may have an arrangement of being separated into at least two regions with a region of the first conductivity type sandwiched therebetween.

With the above-described structure, it becomes even easier for the depletion layer to expand from the interface between the confining region and channel region toward the source electrode side so that the off-state can be achieved with a negative voltage whose absolute value is low. The at least two regions described above may be flat plate-like or column-like in shape.

In the above-described JFET according to the present invention, the overall channel region may include a low impurity concentration region or portion of the first conductivity type provided within the overall channel region, which is in contact with the confining region and the source region. The low impurity concentration region or portion has a concentration lower than a concentration of an impurity of the first conductivity type in a remaining channel portion of the overall channel region.

The depletion layer expands long from the interface between the confining region and the channel region, on the channel region side approximately in proportion to the ratio of the concentration of an impurity of the second conductivity type of the confining region to the concentration of an impurity of the first conductivity type of the channel region. In other words, the depletion layer expands long toward the side on which the impurity concentration is low, approximately in proportion to the ratio of the impurity concentration. Consequently, by providing the low impurity concentration region, portion it becomes possible, with a low reverse bias voltage, to expand the depletion layers even longer to allow the depletion layers expanding from the confining regions on either side to combine and to realize the off-state. In other words, it becomes possible to combine the depletion layers on either side with a negative voltage having a smaller absolute value so as to shut off the passage of charge carriers.

In the above-described JFET according to the present invention, the source region and the channel region are both separated into two regions, and a conductive film is provided which is sandwiched between the two channel regions in a position range that is lower than a top surface level of the channel region.

With the above-described arrangement, the electric resistance of a drift (channel) path that extends in the direction of thickness of the substrate from the two source regions provided on the one surface (front face) side toward the drain region on the other surface (reverse surface) of the semiconductor substrate becomes small. Thus, a portion on which the conductive film is formed with respect to the path partially forms a parallel circuit with respect to the path. As described above, in the case of a JFET in which carriers flow in the direction of thickness of the substrate, it becomes possible substantially to reduce the electric resistance of the channel region that lies along in the direction of thickness. Consequently, it becomes possible to achieve high withstand voltage characteristic specific to the above-described vertical JFET as well as to reduce the power consumed in the channel region, thereby resolving the problem of heat generation. In order to apply a reverse bias voltage to a junction portion between the confining region and the channel region to expand the depletion layer into the channel region so as to achieve the off-state, the second conductivity type impurity concentration of the confining region needs to be higher than the first conductivity type impurity concentration of the channel region. Moreover, the first conductivity type impurity concentration of the channel region can be determined by the required device withstand voltage. The channel region may be formed at a higher position than a surface of the substrate, or the substrate surface layer itself may be the channel region.

In the above-described JFET according to the present invention, the conductive film preferably extends into the drift region.

According to the above-described arrangement, in a vertical JFET, a conductive film is provided deep into a drift (channel) path so that the current that flows through the drift (channel) is reduced, and more current would flow in the conductive film. Consequently, the power loss in the on-state is further reduced, and the variation at each devices due to the impurity concentration and the like of the drift (channel) path becomes even smaller.

In the above-described JFET according to the present invention, for instance, a channel region width from the confining region to a conductive film in the channel region can be made smaller than a depletion layer width in the channel region due to a built-in potential in a junction portion between the confining region and the channel region.

According to the above-described arrangement, in the case where the gate voltage is zero, the channel region of the first conductivity type described above is pinched off by a depletion layer produced due to the above-described built-in potential at the junction portion between the channel region and the confining region of the second conductivity type located outside the channel region. The above-described conductive film is not in contact with the source region that lies on and makes contact with the above-described channel so that the path to the conductive film is also shut off due to the above-described pinch-off. As a result, even a vertical JFET having a high withstand voltage and small consumed power in the on-state can be made normally-off. Thus, the power loss in the off-state is eliminated and application to the control of a motor is facilitated.

In the above-described JFET according to the present invention, the conductive film is one of a semiconductor film including an impurity of high concentration and a metal film.

According to the above-described arrangement, a parallel bypass of low resistance can be conveniently provided to a channel region using a metal film of low resistance. Anything can be utilized as a metal film as long as it can serve as an electrode material; however, it is preferably aluminum (Al) or an aluminum alloy when ease of etching and high conductivity are taken into consideration.

In the above-described JFET according to the present invention, for instance, the semiconductor thin body is an SiC substrate, and a first conductivity type semiconductor film is a first conductivity type SiC film, and a second conductivity type semiconductor film is a second conductivity type SiC film.

SiC has excellent withstand voltage and its carrier mobility is as high as that of Si, and it achieves a high saturation drift speed of the carriers. Consequently, it becomes possible to utilize the above-described JFET for a power high-speed switching device.

A method of manufacturing a JFET according to the present invention includes a step of forming a first semiconductor layer of a first conductivity type of a concentration C1 that is lower than a concentration Cs on a semiconductor substrate of the first conductivity type including a first conductivity type impurity of concentration Cs (a semiconductor substrate of the first conductivity type of concentration Cs), a step of forming a second semiconductor layer of the first conductivity type of a concentration C2 that is lower than concentrations Cs and C1 on the first semiconductor layer of the first conductivity type, and a step of forming a third semiconductor layer of the first conductivity type of a concentration C3 that is higher than concentrations C1 and C2 on the second semiconductor layer of the first conductivity type. This manufacturing method further includes a step of providing a mask for shielding a source region on the third semiconductor layer of the first conductivity type and removing the third semiconductor layer of the first conductivity type other than the source region by etching, and a step of doping the second semiconductor layer of the first conductivity type on either side of the source region with a second conductivity type impurity to form a second conductivity type confining region and a second conductivity type gate region of a concentration C4 that is higher than concentration C2.

According to this manufacturing method, the number of steps is reduced and the number of masks is accordingly reduced so that mask alignment is simplified and the manufacture of the FET is facilitated. Consequently, the yield improves and the reduction in manufacturing cost becomes possible.

In the above-described manufacturing method of the JFET according to the present invention, for instance, ion implantation in second conductivity type impurity doping is preferably performed using the same mask used for etching of the third semiconductor layer of the first conductivity type.

According to this manufacturing method, etching and ion implantation can be performed using the same mask so that the number of steps is reduced and reduction in the yield due to misalignment can be avoided. As a result, the manufacturing cost can be reduced.

BEST MODES FOR CARRYING OUT THE INVENTION

Next, the embodiments of the present invention will be described using the drawings.

First Embodiment

Figure 1:
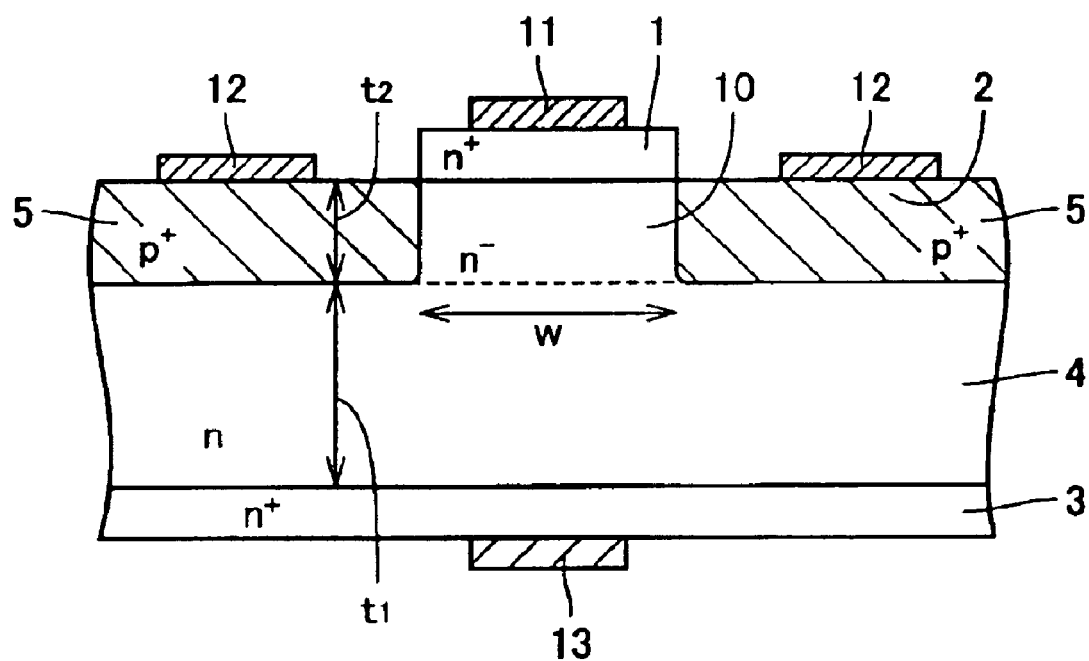
FIG. 1 is a cross sectional view of an arrangement of a JFET according to a first embodiment of the present invention.

FIG. 1 is a cross sectional view of an arrangement of a JFET according to the first embodiment of the present invention. In FIG. 1, a source region 1 is formed in a shape of a projection protruding from a surface of a semiconductor substrate and includes an n type impurity of a high concentration that largely exceeds $10^{19}$ cm$^{-3}$ such that an ohmic contact is established with a source electrode 11 formed by Ni, for instance. A channel region 10 includes an n type impurity at a concentration of about $1\times10^{15}$ cm$^{-3}$, for instance, and is formed beneath source region 1. A gate region 2 includes a p type impurity at a concentration of $10^{19}$ cm$^{-3}$, for instance, and is formed on a surface immediately below each of two gate electrodes 12. A confining region 5 encloses gate region 2 and is formed to a certain thickness of the semiconductor substrate such that channel region 10 is sandwiched from either side. Confining region 5 includes the same kind of the p type impurity of the same concentration as the gate region. A drift region 4 makes contact with channel region 10 at one end and is confined by confining region 5, and is formed in a spread out manner in the semiconductor substrate to a certain thickness toward the other surface of the semiconductor substrate, and makes contact with a drain region 3 at the other end. Drift region 4 includes an n type impurity at about $9\times10^{16}$ cm$^{-3}$, for instance. In contact with drift region 4, drain region 3 including an n type impurity of a high concentration, i.e., a concentration that largely exceeds $10^{19}$ cm$^{-3}$, for instance, is formed exposed on the other surface. A drain electrode 13 is formed at a position on the other surface opposite to source electrode 11 provided on one surface. As described above, all electrodes are preferably formed by Ni, but an electrode may be formed by some other metal film, or may be a multilayer film in which several kinds of metal films are formed in layers. In the first embodiment, each of the gate electrode, the source electrode, and the drain electrode forms an ohmic contact with a region with which it makes contact. The desirable impurity concentrations for each of the regions may be listed as follows:

Source region 1, drain region 3: n type impurity$\gg1\times10^{19}$ cm$^{-3}$

Channel region 10: n type impurity=$1\times10^{15}$ cm$^{-3}$

Drift region 4: n type impurity=$9\times10^{16}$ cm$^{-3}$

Confining region 5, gate region 2: p type impurity$\gg1\times10^{19}$ cm$^{-3}$

As can be seen in FIG. 1, in the JFET with the structure as described above, there is no contact plane surface between the confining region 5 and the source region 1, because the source region 1 is arranged on top of the top surface of the semiconductor substrate while the confining region 5 is arranged within the semiconductor substrate below the top surface.

Figure 2:
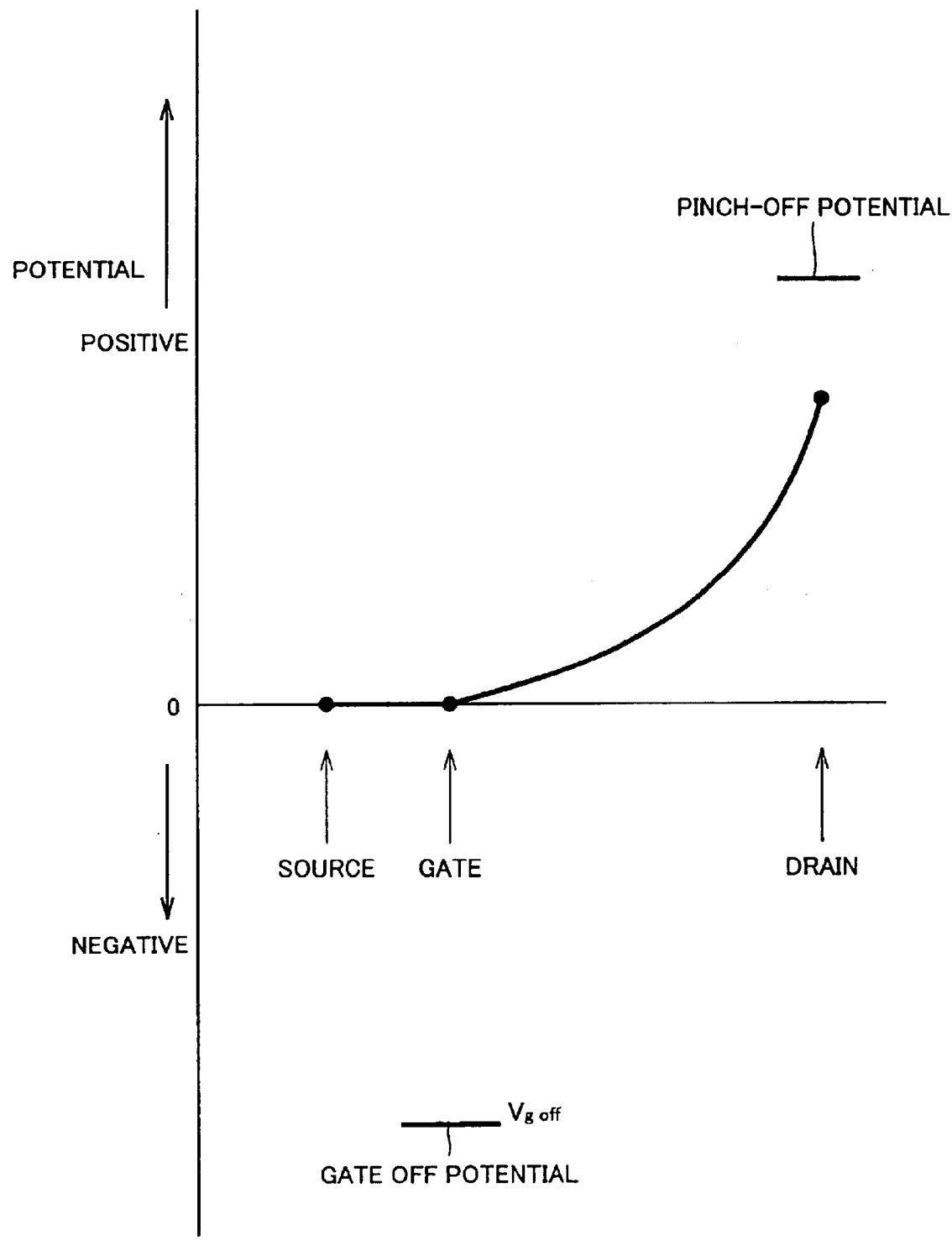
FIG. 2 is a diagram representing an example of a voltage in the on-state of the JFET in FIG. 1.

FIG. 2 is a diagram illustrating the respective voltages of a source, a gate, and a drain in the on-state of the field effect transistor shown in FIG. 1. Normally, a source electrode is grounded, and a gate voltage is used around voltage zero which is approximately the same as a source voltage. In the on-state, electrons move from source region 1 that is an n type impurity region via drift region 4 having a length of about 2 μm to 10 μm and being stretched out in a direction of thickness of a semiconductor substrate 15 and reach drain region 3.

In a case where the gate voltage that is around zero is used, when a drain voltage is set to positive and raised high, an electron flow would flow in channel region 10 having a range confined by confining region 5 that is a p type impurity region and in drift region 4 without confinement. In the on-state, there is no resistance that blocks the flow of carriers in this path so that the consumption of the power hardly occurs. Thus, the present JFET can provide a device that excels in withstand voltage performance with low consumed power.

Figure 3:
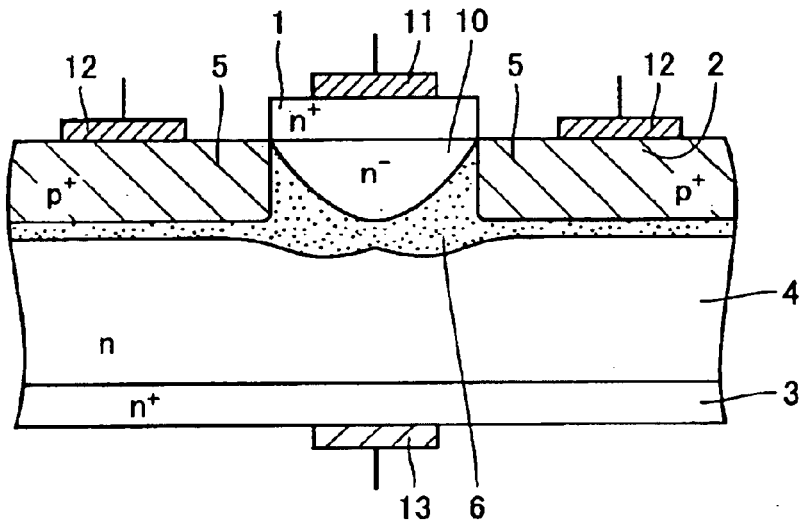
FIG. 3 is a diagram representing a depletion layer formed in a pinch-off-state.

When the drain voltage is raised, the potential distribution of drift region 4 rises steeply in the vicinity of the drain region so that the electron flow is accelerated and an electric field of a reverse bias is formed in a portion of the drift region close to the confining region, so that a depletion layer is generated toward the drift region. The depletion layers grow with the rise of the drain voltage, and a pinch-off is established when the growth reaches a position where both depletion layers make contact in the drift region. When the pinch-off takes place, the drain current does not increase even with a further increase in the drain voltage and maintains a constant saturation current. FIG. 3 is a diagram showing a pinch-off occurring and how a depletion layer 6 is formed in drift region 4 that is a low impurity concentration region of a pn junction portion. The electron flow is inhibited by depletion layer 6 and the drain current becomes saturated.

Figure 4:
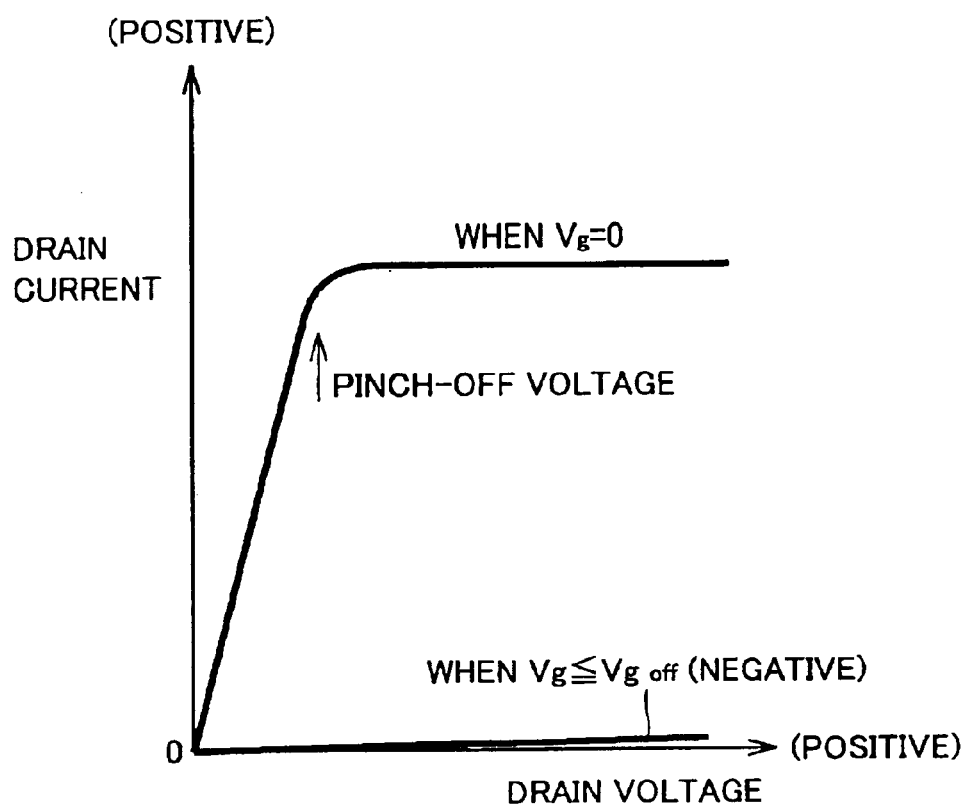
FIG. 4 is a diagram representing a relation between a drain voltage and a drain current.

FIG. 4 is a diagram representing a relation between the drain current and the drain voltage. When the gate voltage is around zero, as the drain voltage is increased, the drain current increases linearly. When the drain voltage reaches the pinch-off voltage, however, a depletion layer would grow from pn junction portions on either side of the drift region toward the drift region side as described above, thereby pinching off the drift region and causing saturation of the drain current. The gradient of the rise of the drain current is great in comparison with the conventional JFET. Thus, a high current can be achieved with low drain voltage, and as a result, large current can be supplied with smaller loss than in the conventional example. FIG. 4 also shows the off-state in which the drain current hardly flows in the case where a voltage lower than Vgoff (negative) is applied as the gate voltage (it is never made lower than Vgoff by more than a certain value, however).

Figure 5:
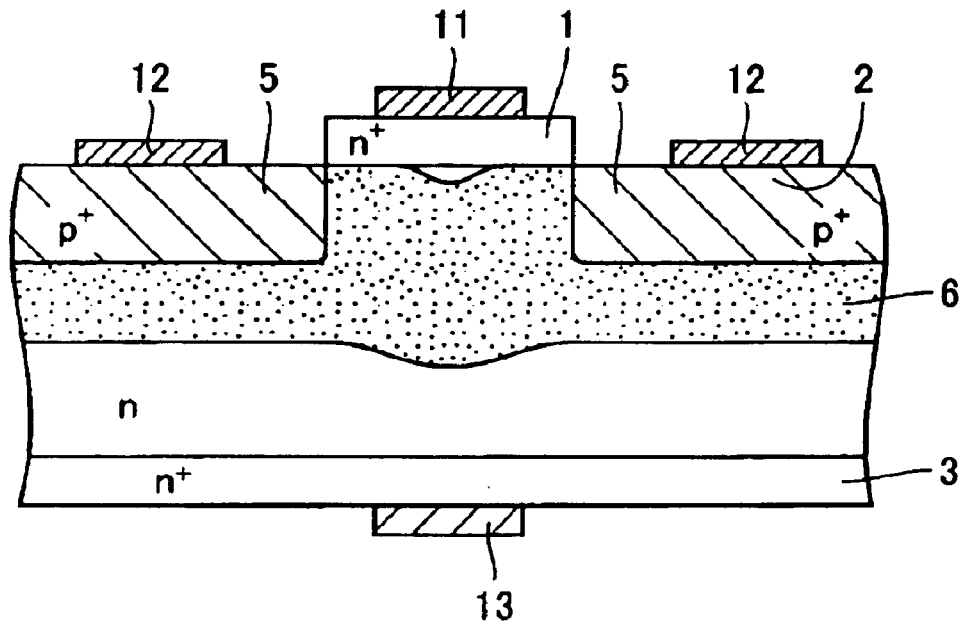
FIG. 5 is a diagram representing a depletion layer formed upon application of a high voltage in the off-state.

In such off-state, as shown in FIG. 2, a reverse bias voltage is applied to gate electrode 12 to cause a depletion layer to be projected to channel region 10 from a pn junction interface between channel region 10 and confining region 5. The off-state is realized when the depletion layer blocks the cross section of a path toward the other surface in the channel region. In the off-state; as the drain voltage is raised, as shown in FIG. 5, depletion layer 6 is generated at a pn junction interface between confining region 5 and drift region 4 and becomes projected toward the drift region of a low concentration. This depletion layer withstands the voltage so that the withstand voltage performance of the device improves.

While the control of a drain current, the ON-OFF and the like is performed by a drain voltage and a base voltage in an SIT that is a conventional vertical JFET, as described above, the ON-OFF control is performed by the presence/absence of formation of the above-described depletion layer in the field effect transistor of the present invention. As a result, it has become possible to perform the control of high voltage and high current with certainty with the field effect transistor of the present invention.

When a high voltage is applied to a drain while the current is shut off in the off-state, depletion layer 6 is formed in a pn junction portion that is an interface between confining region 5 and drift region 4 close to a drain region, as shown in FIG. 5. Since this depletion layer 6 withstands the voltage between the drain and the gate, a field effect transistor with excellent withstand voltage can be achieved. This depletion layer 6 is formed toward a low impurity concentration side, with the depth being greater where the impurity concentration is lower, in a manner similar to the mechanism by which the above-described depletion layer is formed. As shown in FIG. 5, depletion layer 6 still has room for growth on the drain side even when the voltage is further increased from the state of FIG. 5 so that an extremely high voltage can be endured.

Figure 6:
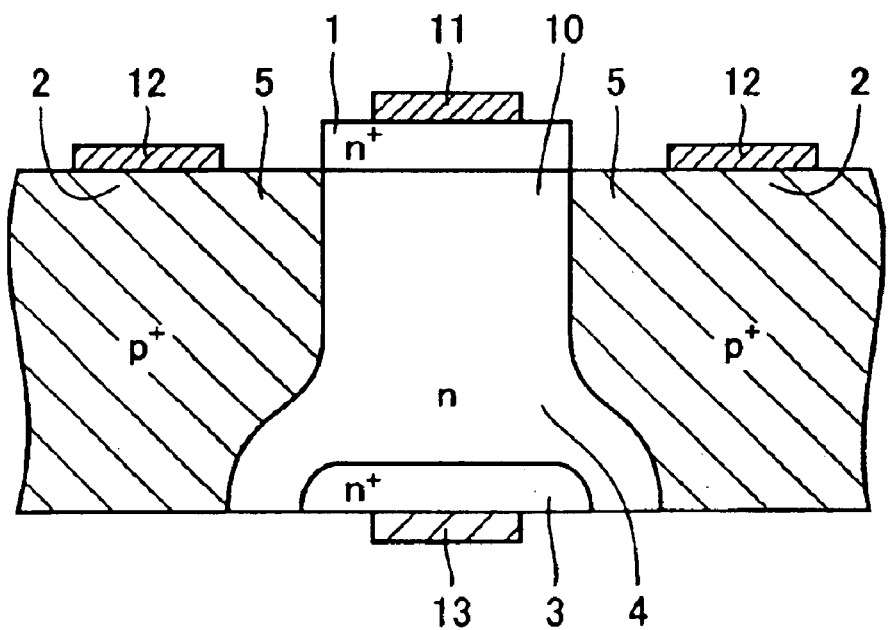
FIG. 6 is a diagram representing another example of a JFET similar to the JFET according to the first embodiment.
Figure 7:
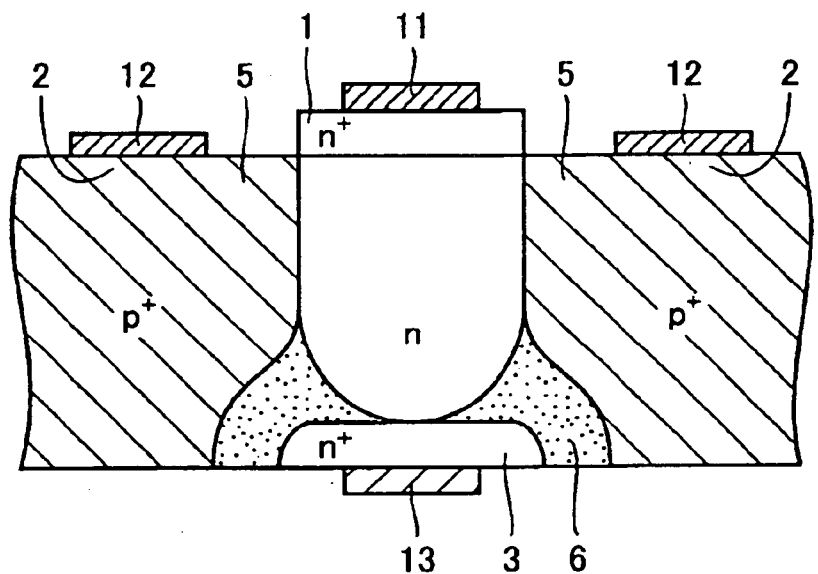
FIG. 7 is a diagram representing a portion on the drain region side of a depletion layer formed upon application of a high voltage in the off-state of the JFET in FIG. 6.

Although in some cases, drain region 3 is given a structure of being spread on a surface as shown in FIG. 1, drain region 3 may be confined and be given a structure in which drift region 4 above the drain region is also covered by confining region 5, as shown in FIG. 6. In the case of the drain region and the drift region of the shapes shown in FIG. 6, when a high voltage is applied to a drain in the off-state, depletion layer 6 that withstand the high voltage is formed as shown in FIG. 7.

Figure 8:
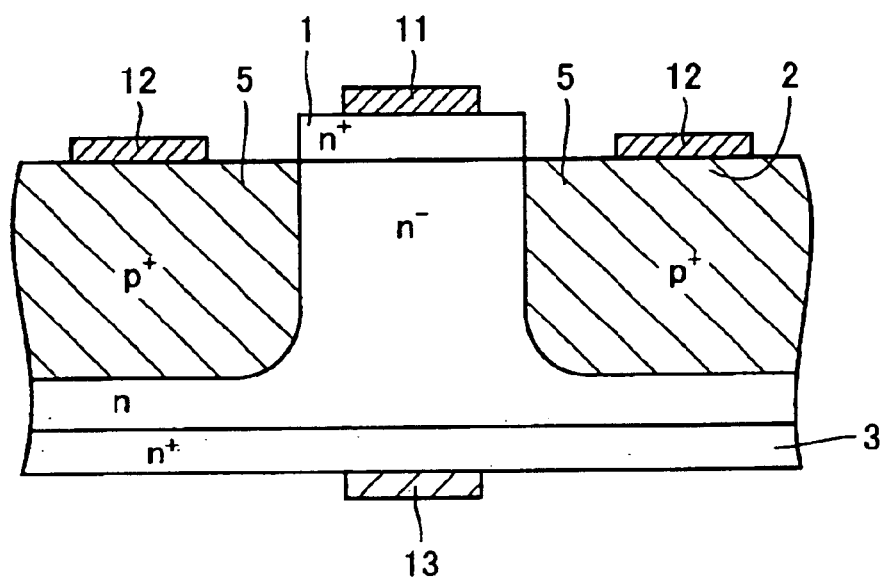
FIG. 8 is a diagram representing a further example of a JFET similar to the JFET according to the first embodiment.

In addition, the scope of the present invention also includes a structure shown in FIG. 8 in which a thickness of the confining region is increased and drain region 3 and drift region 4 are given the structure of being spread on a surface as shown in FIG. 1. In this case, a thickness of drift region 4 sandwiched by the confining region and the drain region becomes thin so that a significant improvement in the withstand voltage cannot be expected; however, the thickness of the confining regions sandwiching the channel region is thick so that a normally-off JFET can be formed with ease.

Figure 9:
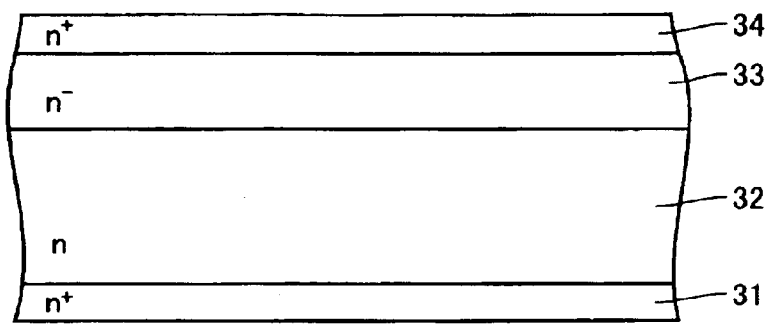
FIG. 9 is a cross sectional view showing a stage of forming onto a semiconductor substrate a film in which a source region is to be formed in an intermediate stage of the manufacture of the JFET shown in FIG. 1.
Figure 10:
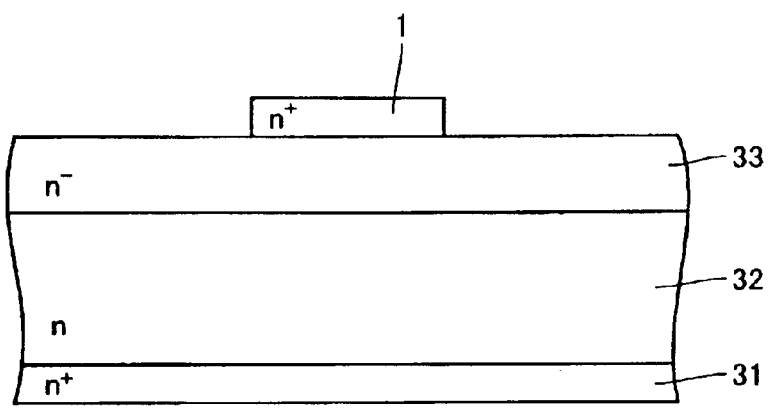
FIG. 10 is a cross sectional view showing a stage of patterning the source region by RIE after the step of FIG. 9.
Figure 11:
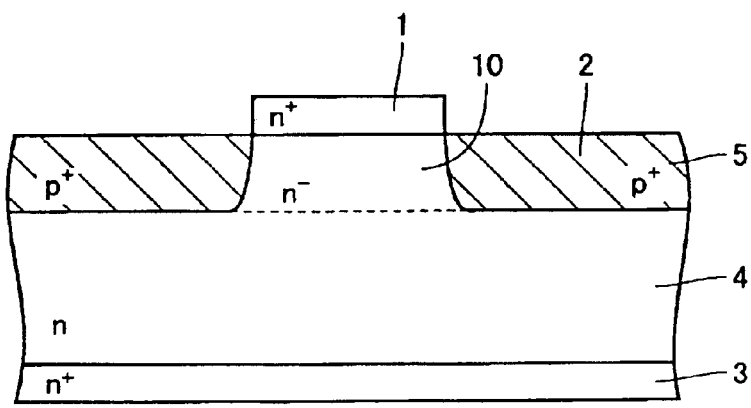
FIG. 11 is a cross sectional view showing a stage of doping an impurity to form a gate region and a confining region after the step of FIG. 10.

Next, a method of manufacturing the JFET shown in FIG. 1 will be described. First, as shown in FIG. 9, on an $n^+$ type semiconductor substrate 31, an n type semiconductor layer 32, an $n^-$ semiconductor layer 33, and an $n^+$ semiconductor layer 34 are successively formed. Thereafter, as shown in FIG. 10, to form source region 1, other portions are etched and removed by RIE (Reactive Ion Etching). Thereafter, as shown in FIG. 11, p type impurity ions are implanted to form gate region 2 and confining region 5. Then, Ni is formed as an electrode, and the JFET as shown in FIG. 1 is completed. The electrodes in the first embodiment, including the gate electrode, are provided such that an ohmic contact is formed. Since the impurity concentration of gate region 2 is high, the formation of the ohmic contact is easy.

According to this manufacturing method, the manufacturing steps are simplified, and the number of masks is reduced. Moreover, the chance of mask misalignment occurring reduces as well so that the yield can be improved.

Example Corresponding to First Embodiment

A semiconductor thin body and a semiconductor layer formed thereon were all formed by 4H-SiC, and withstand voltage performance and on-resistance (resistance in the on-state) of a JFET having the following dimensions were measured (with respect to a drift region thickness $t_1$, a confining region thickness $t_2$, a channel region width W, see FIG. 1).

Drift region thickness $t_1$=2.2 μm
Confining region thickness $t_2$=1 μm
Channel region width W=10 μm
Result of Measurement
Voltage resistance: 380 V (gate voltage when OFF: at minus 22 V)
On-resistance: 0.7 mΩ·cm$^2$ As described above, from the FET of the present invention, a result of high withstand voltage performance and extremely low on-resistance was obtained. Consequently, since it achieves low consumed power with high withstand voltage and has a simple structure, it is easy to manufacture and the manufacturing cost can be kept low.

Second Embodiment

Figure 12:
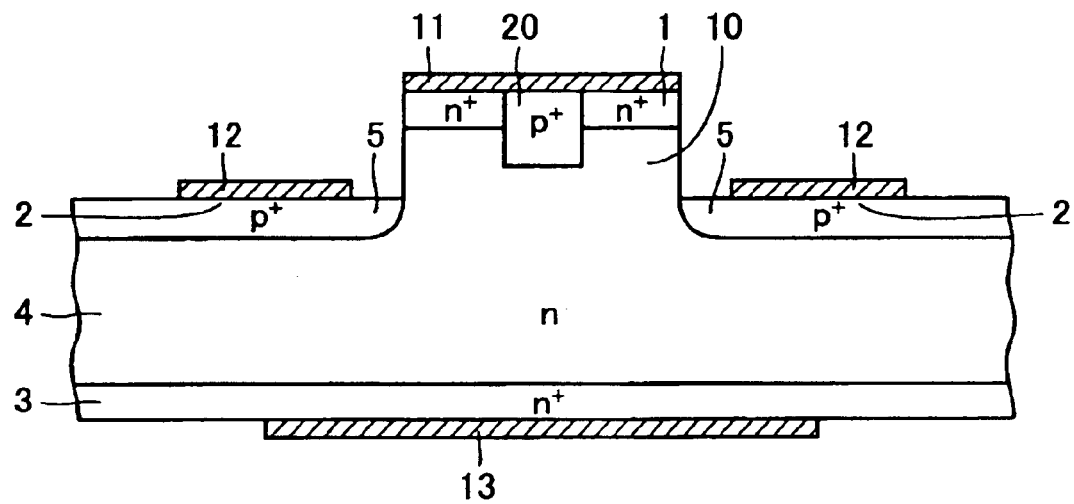
FIG. 12 is a cross sectional view of a JFET according to a second embodiment of the present invention.

FIG. 12 is a cross sectional view of an arrangement of a JFET according to the second embodiment of the present invention. A source electrode 11 and a gate electrode 12 are provided on one main surface (front face) of a semiconductor substrate, while a drain electrode 13 is provided on the other main surface (reverse face). A source region 1 is formed in contact with source electrode 11, a gate region 2 is formed in contact with gate electrode 12, and a drain region 3 is formed in contact with drain electrode 13, respectively. Channel region 10 is provided in contact with source region 1 and gate region 2 and controls an on-state and an off-state of carriers by potentials of the gate region and the source region. To bring about the on-state, zero voltage that is the same as that applied to the source electrode or a positive voltage is applied to the gate electrode to cause the electrons of source region 1 to move toward drain region 3 having a higher potential. A drift region 4 becomes a passage of electrons that are the carriers headed from channel region 10 to drain region 3. A width of drift region 4 may be confined by a confining region 5 of a p type conductive region, or may not be confined by confining region 5 as shown in FIG. 12. This JFET employed in a power semiconductor device is used to facilitate increasing and decreasing of the voltage and the like by providing a direct current in a pulsed manner by performing the switching of ON-OFF. A significant characteristic that the JFET for power semiconductor device of FIG. 12 has is that it is provided with an interposed region 20 that is in contact with source electrode 11 and that penetrates through source region 1 and protrudes into channel region 10.

Figure 16:
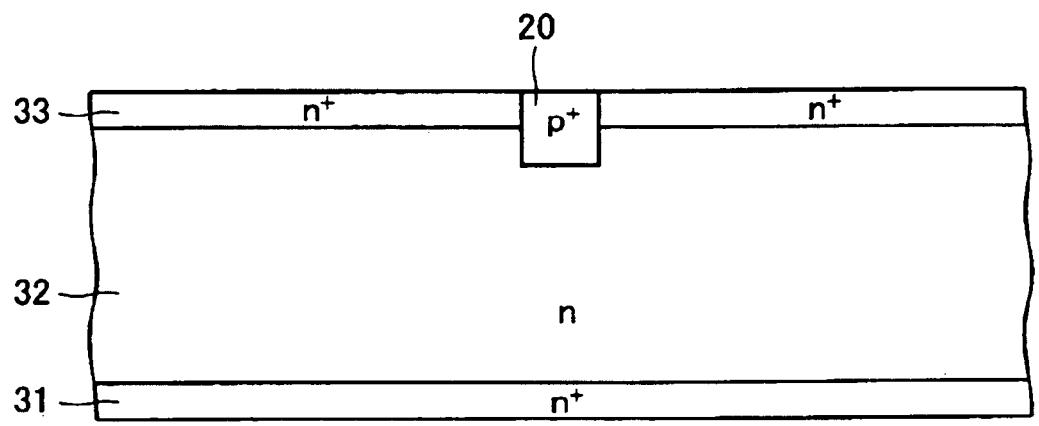
FIG. 16 is a cross sectional view showing a stage of removing the mask and forming an interposed region after the stage of FIG. 15.
Figure 13:
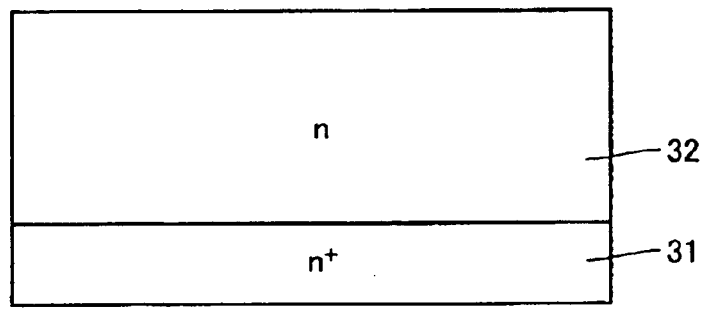
FIG. 13 is a cross sectional view showing a stage of forming an n type semiconductor layer on an n$^+$ type substrate in the manufacture of the JFET of FIG. 12.
Figure 14:
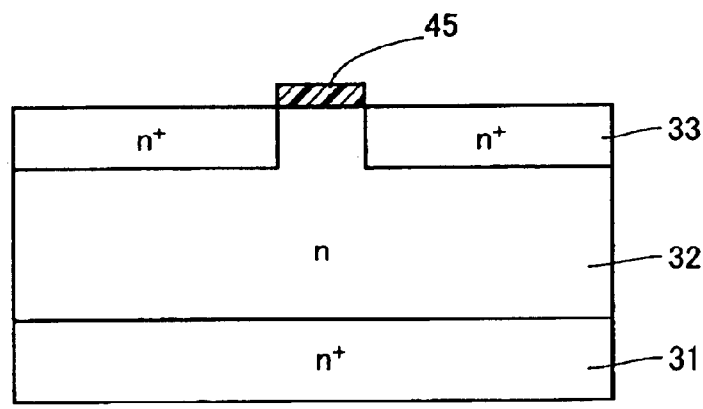
FIG. 14 is a cross sectional view showing a stage of forming a mask on a region where a conductive layer is to be formed and performing ion implantation of an n$^+$ type impurity on either side of the mask after FIG. 13.
Figure 15:
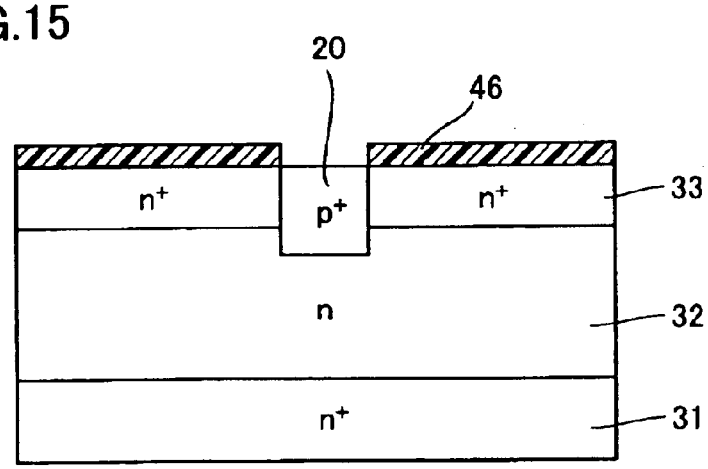
FIG. 15 is a cross sectional view showing a stage of removing the above-described mask and forming a mask on the n$^+$ type semiconductor layer to perform ion implantation of a p$^+$ type impurity after FIG. 14.
Figure 17:
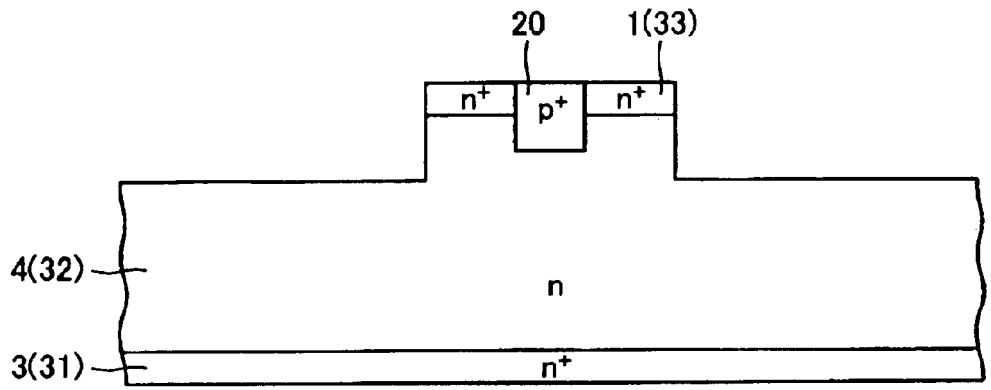
FIG. 17 is a cross sectional view showing the state after having performed etching to form a source region and a channel region after the step of FIG. 16.
Figure 18:
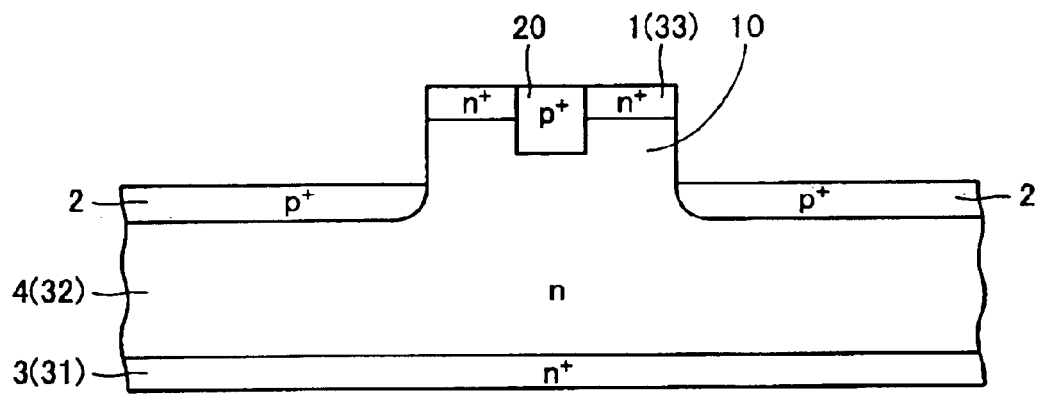
FIG. 18 is a cross sectional view showing a stage of implanting an impurity and forming a gate region after the step of FIG. 17.

Next, a method of manufacturing the JFET shown in FIG. 12 will be described. First, as shown in FIG. 13, an n type semiconductor layer 32 is formed on an $n^+$ type semiconductor substrate 31. Thereafter, as shown in FIG. 14, a mask 45 is formed on a region where a conductive layer is to be formed, and ion implantation of an n type impurity to a high concentration is effected on either side of the mask to form an $n^+$ layer. Then, as shown in FIG. 15, the above-described mask is removed and a mask 46 is newly formed on the $n^+$ layer on either side, ion implantation of a p type impurity to a high concentration is effected to form a $p^+$ type conductive layer. This $p^+$ type impurity region becomes interposed region 20 as shown in FIG. 16. Next, as shown in FIG. 17, to form source region 1, other portions are etched and removed by RIE (Reactive Ion Etching). Thereafter, as shown in FIG. 18, p type impurity ions are implanted to form gate region 2. Then, Ni is formed as an electrode, and the power semiconductor device shown in FIG. 12 is completed. The electrodes in the second embodiment, including the gate electrode, are provided such that an ohmic contact is formed. Since an impurity concentration of each region is high, the formation of the ohmic contact is easy.

Figure 19:
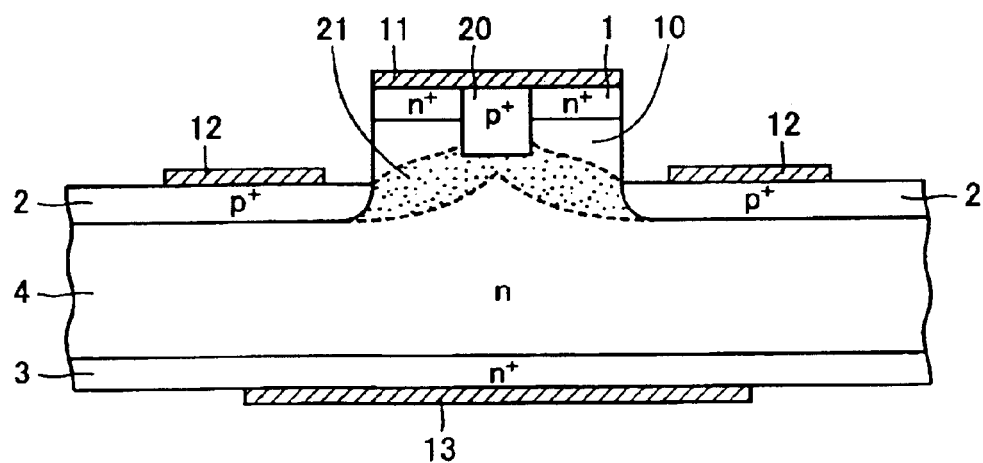
FIG. 19 is a diagram representing a depletion layer formed by applying a reverse bias voltage to the JFET of FIG. 12.

Next, the mechanism in which a depletion layer is formed when a reverse bias voltage is applied between source electrode 11 and gate electrode 12 to cause the off-state will be described. In FIG. 12, when a negative voltage that is lower than the voltage applied to source electrode 11 is applied to gate electrode 12, a reverse bias voltage is applied to an interface of a gate region and a channel region. At this time, at the interface of a gate region and a channel region, a depletion layer grows on channel region 10 side having a low impurity concentration. Due to the presence of interposed region 20 of the p conductivity type that makes contact with source electrode 11, this depletion layer 21 easily expands to the source electrode side with a low voltage, as shown in FIG. 19. Consequently, with a voltage that is lower than that conventionally used, two depletion layers 21 that stretch out from either side of the channel region combine around the center of the width of channel region 10 at a tip portion of interposed region 20 and form a barrier against electrons. The electrons sense a potential barrier at a boundary portion of a p type conductive region so that it is not requisite that the depletion layers are combined, and the movement of electrons can be interrupted by interposed region 20 making contact with depletion layer 21. As a result, the off-state can be realized with a negative voltage whose absolute value is smaller than that in a conventional example, and it becomes possible to achieve an even lower loss as a power switching device.

The semiconductor substrate used for the JFET shown in FIG. 12 is an SiC substrate having formed thereon an SiC layer by increasing the thickness by crystal growth. A material of the semiconductor substrate, however, is not limited to SiC, and Si, GaAs and the like may be used.

Third Embodiment

Figure 20:
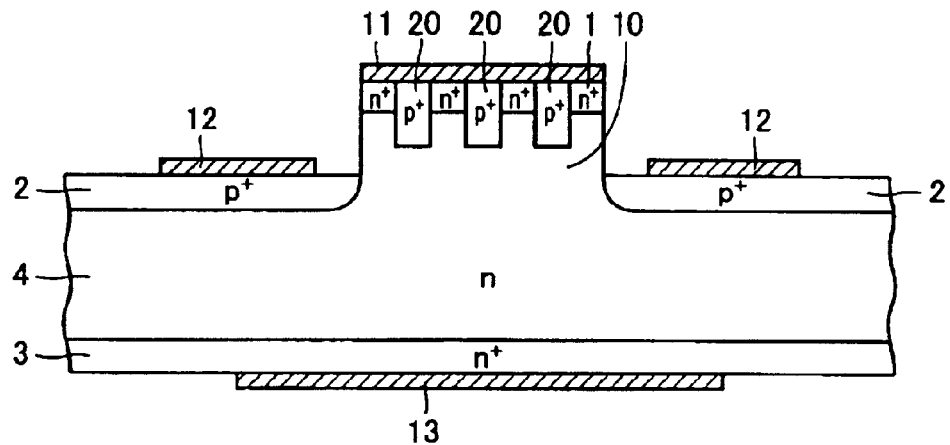
FIG. 20 is a cross sectional view of a JFET according to a third embodiment of the present invention.
Figure 21:
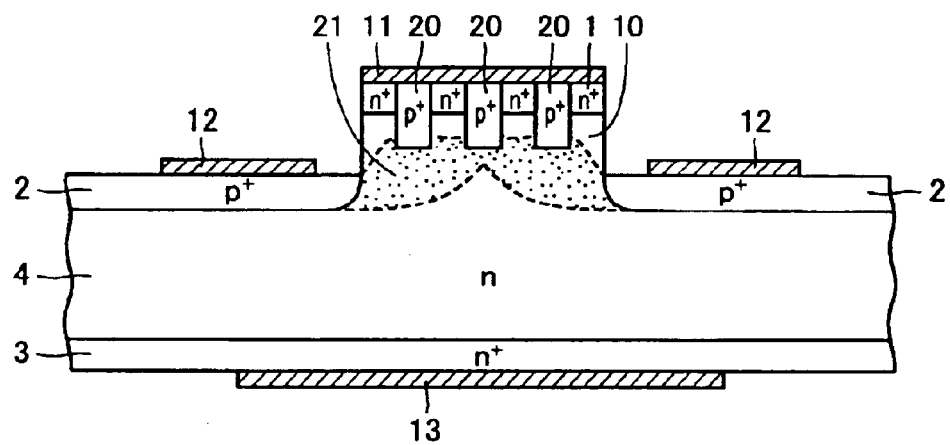
FIG. 21 is a diagram representing a depletion layer formed by applying a reverse bias voltage to the JFET of FIG. 20.

FIG. 20 is a cross sectional view showing a JFET used as a power semiconductor device in the third embodiment of the present invention. A significant difference between this device and the power semiconductor device of the second embodiment is that a plurality of interposed regions 20 are provided. A method of manufacturing the semiconductor device shown in FIG. 20 is basically the same as the method described in the second embodiment. When a reverse bias voltage is applied between a source electrode and a gate electrode, due to the presence of interposed regions 20, a depletion layer 21 readily stretches out toward interposed regions 20 of the source region by a reverse bias voltage that is lower than that of the conventional example, as shown in FIG. 21. As a result, the off-state can be realized with a voltage lower than that of the conventional example, and it becomes possible to achieve an even lower loss as a power switching device.

Fourth Embodiment

Figure 22:
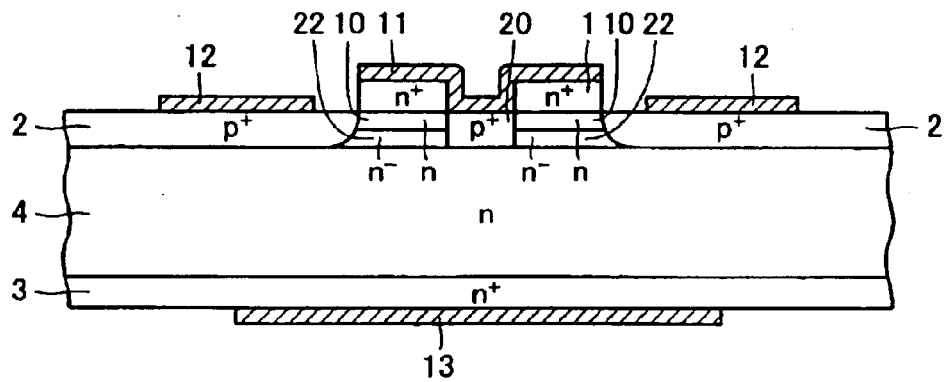
FIG. 22 is a cross sectional view of a JFET according to a fourth embodiment of the present invention.
Figure 23:
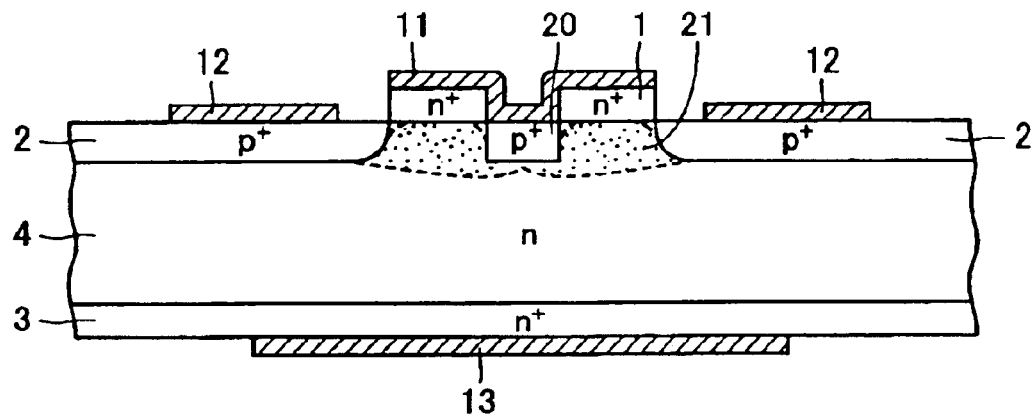
FIG. 23 is a diagram representing a depletion layer formed by applying a reverse bias voltage to the JFET of FIG. 22.

In a JFET used for the power semiconductor device of the fourth embodiment of the present invention, the overall channel region 22 includes an $n^-$ layer (low impurity concentration region or portion) that has a low impurity concentration and is disposed in contact with a gate region 2 to facilitate the formation of a depletion layer 21 that expands into the channel region 22 including the low impurity concentration portion or region, as shown in FIGS. 22 and 23. In addition, a tip portion of an interposed region 20 stretches out beyond a side of the gate region 2 to a position reaching a drift region 4. When a reverse bias voltage is applied to a power semiconductor device having such a structure, a depletion layer 21 expands into low impurity concentration region ($n^-$ layer) of the overall channel region 22 from an interface of the gate region and the low impurity.

Fifth Embodiment

Figure 24:
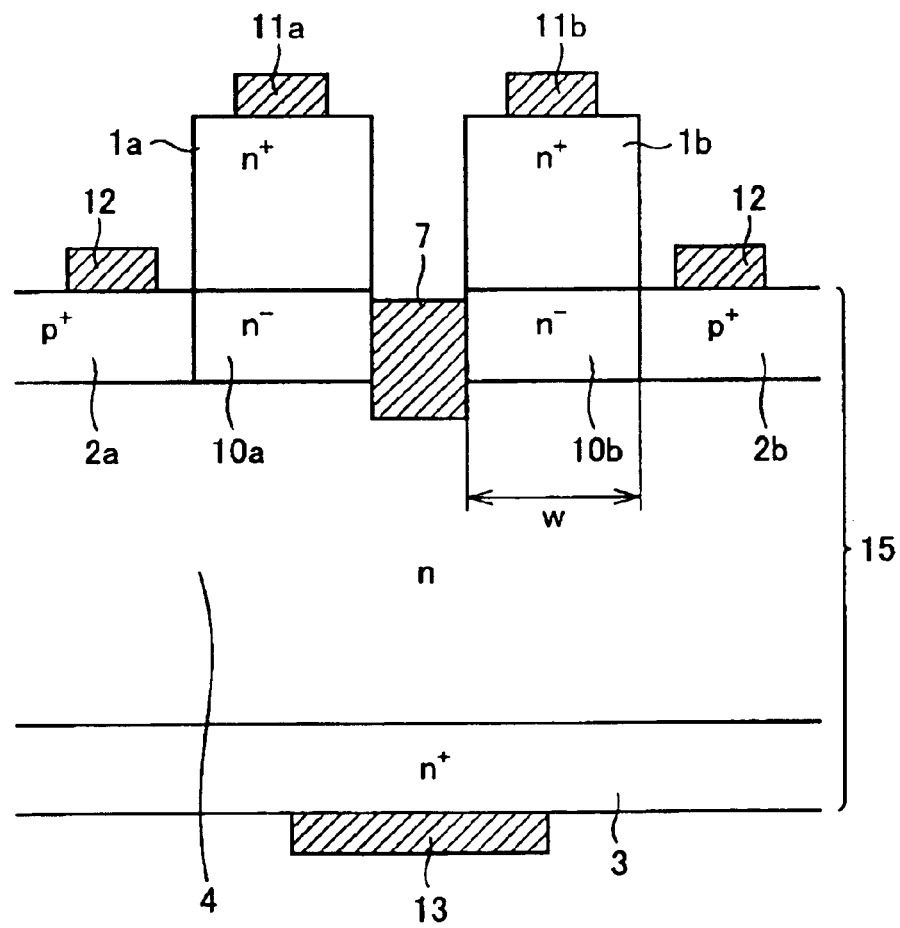
FIG. 24 is a cross sectional view of a JFET according to a fifth embodiment of the present invention.
Figure 25:
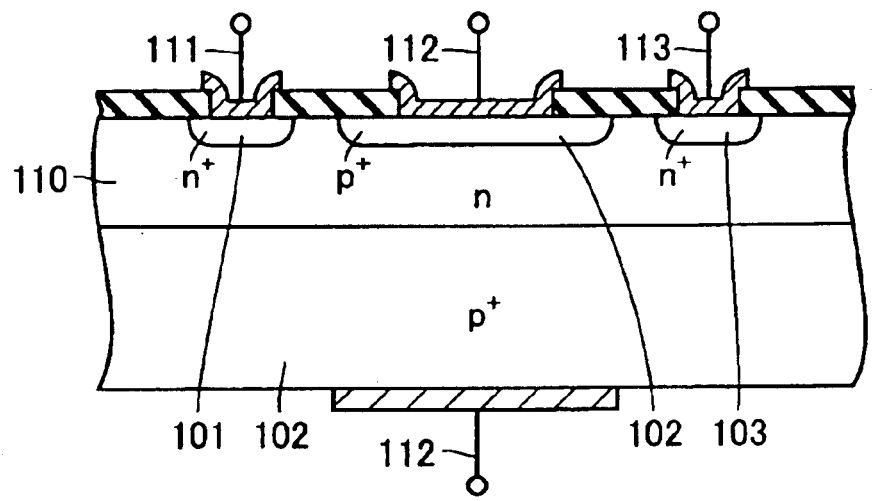
FIG. 25 is a cross sectional view of a conventional horizontal JFET.
Figure 26:
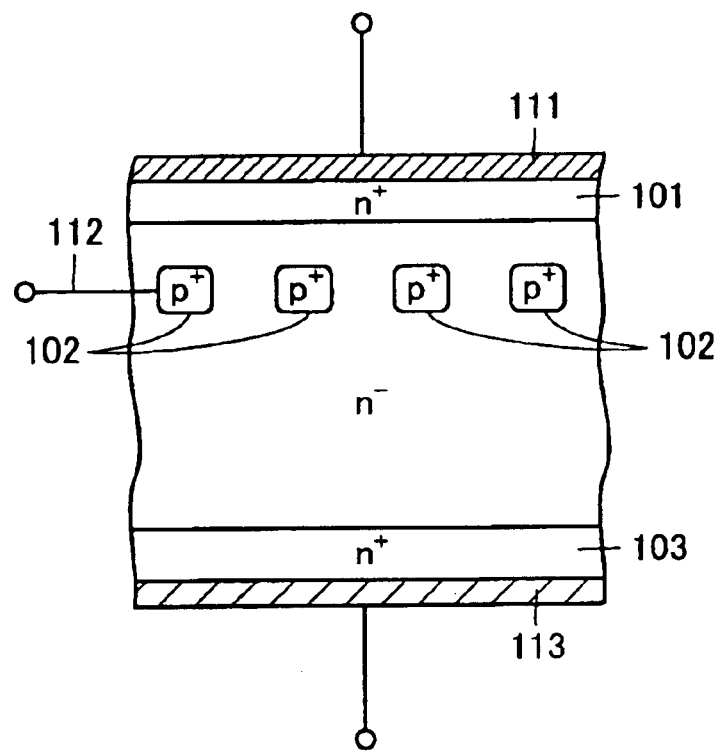
FIG. 26 is a cross sectional view of an SIT that is a conventional vertical JFET.

FIG. 24 is a cross sectional view showing a JFET according to the fifth embodiment of the present invention. In this diagram, an n type impurity region on an n type SiC substrate has an impurity concentration that is determined by a device voltage resistance, and also serves as a first semiconductor layer of a first conductivity type (n type). On a surface (front face) of an n type SiC substrate 15, an aluminum film 7 is formed filling a groove to a prescribed height. An n type SiC film forming channel regions 10a and 10b is formed on either side of aluminum film 7. A height of channel regions 10a and 10b is set a little higher than a height of the above-described aluminum film 7. In contact with the two channel regions 10a and 10b, p type SiC film 2a and 2b is formed on the outer side, and gate electrodes 12 are disposed thereon. On the two channel regions 10a and 10b, source regions 1a and 1b are respectively formed, and source electrodes 11a and 11b are disposed thereon. Moreover, on the reverse face of n type SiC substrate 15, an $n^+$ type SiC film 3 is formed, and a drain electrode 13 is disposed thereon. Needless to say, an ohmic contact is formed between each electrode and a semiconductor layer.

In the on-state, carriers flow across the substrate in a direction of thickness from source regions 1a and 1b to a drain region 3. Thus, a normally-on JFET is realized. At this time, although the current is divided into a path via aluminum film 7 and a path via the channel region and the n type SiC substrate, the electric resistance of the aluminum film is extremely low so that the current mainly flows on the aluminum film side. Thus, the present JFET is not affected by variation in dimension and in an impurity concentration in the channel region, and the variation at each devices can be greatly reduced.

In the off-state, a negative voltage whose absolute value is large (−15 to −25 V) is applied to a gate, and consequently, reverse bias voltages are applied to the junction portions between channel regions 10a and 10b and the p type regions on the outer side thereof. Thus, a depletion layer width expands mainly toward the side on which the impurity concentration is low. When this depletion layer expands the entire channel region, the path leading from the source region via substrate 15 to drain region 3 is shut off. The height of aluminum film 7 is set to be lower than channel regions 10a and 10b so that the path via the aluminum film is also shut off, and the off-state is realized.

The vertical JFET shown in FIG. 24 has high withstand performance so that, by employing the JFET of the present embodiment, it becomes possible to provide a high voltage power device having small characteristic variation at each devices.

Moreover, in FIG. 24, by making channel region width W shorter than a width of the depletion layer due to a built-in potential of the above-described pn junction portion, the channel region is shut off and the off-state is realized at a gate voltage of zero. Thus, a JFET of a normally-off operation can be obtained.

While the embodiments and the example of the present invention are described above, the embodiments and the example disclosed above are only illustrative, and the scope of the present invention is not limited by these embodiments and the example. The scope of the present invention is indicated by the description of the claims and is further intended to include the meaning equivalent to the claims and all modifications within the scope.

INDUSTRIAL APPLICABILITY

A JFET according to the present invention can perform a high current, high voltage switching operation with a lower loss than in the conventional example. Moreover, by providing an interposed region that makes contact with a source electrode and that expands to a channel region, an off-state can be realized with a reverse bias voltage whose absolute value is smaller than that of the conventional example, and it becomes possible to provide a power semiconductor device of an even lower loss as a bulk power switching device. Furthermore, by providing a conductive layer in parallel to the channel region, the on-resistance can be brought to a low level, and the variation at each devices of the JFET can be reduced.

What is claimed is:

1. A junction field effect transistor, comprising:
   a gate region of a second conductivity type provided on one main surface of a semiconductor thin body consisting of an SiC substrate;
   a source region of a first conductivity type provided on said one main surface;
   a channel region of the first conductivity type that adjoins said source region;
   a confining region of the second conductivity type that adjoins said gate region and encloses and confines a range of said channel region;
   a drain region of the first conductivity type provided on an other main surface of said semiconductor thin body; and
   a drift region of the first conductivity type that continuously lies in a direction of thickness of said semiconductor thin body from said channel region to said drain region;
   wherein:
   a concentration of an impurity of the first conductivity type in said drift region and said channel region is lower than a concentration of an impurity of the first conductivity type in said source region and said drain region and lower than a concentration of an impurity of the second conductivity type in said confining region,
   said source region, said channel region, said drain region and said drift region are formed of at least one first SiC film having the first conductivity type,
   said gate region and said confining region are formed of at least one second SiC film having the second conductivity type,
   a first conductivity type impurity concentration of said drift region is higher than a first conductivity type impurity concentration of said channel region, and
   there is no contact plane surface between said confining region and said source region.

2. The junction field effect transistor according to claim 1, wherein said confining region confines and encloses said gate region from an inner side of said semiconductor thin body.

3. The junction field effect transistor according to claim 1, wherein a location and spatial extent of said gate region coincides with said confining region.

4. The junction field effect transistor according to claim 1, wherein said source region is formed protruding from the one main surface and said channel region is formed beneath said source region in a continuous manner.

5. The junction field effect transistor according to claim 1, wherein said gate region comprises two gate region portions, said confining region comprises two confining region portions, the two gate region portions are respectively confined and enclosed by the two confining region portions, and said channel region is disposed in contact with and between the two confining region portions.

6. The junction field effect transistor according to claim 1, wherein a width of the channel region sandwiched between two portions of said confining region is smaller than a thickness of a depletion layer due to a built-in potential in a junction portion between said confining region and the channel region.

7. A method of manufacturing the junction field effect transistor according to and incorporating all limitations of claim 1, wherein said at least one first SiC film having the first conductivity type includes a semiconductor substrate and first, second and third semiconductor layers, and wherein said method comprises the steps of:
   providing said semiconductor substrate of the first conductivity type, in which said drain region is to be formed, including a first conductivity type impurity of concentration Cs;
   forming said first semiconductor layer, in which said drift region is to be formed, of the first conductivity type having an impurity concentration C1 that is lower than said concentration Cs, on the semiconductor substrate;
   forming said second semiconductor layer, in which said channel region is to be formed, of the first conductivity type having an impurity concentration C2 that is lower than said concentrations Cs and C1, on said first semiconductor layer of the first conductivity type;

forming said third semiconductor layer, in which said source region is to be formed, of the first conductivity type having an impurity concentration C3 that is higher than said concentrations C1 and C2, on said second semiconductor layer of the first conductivity type;

providing a mask for shielding said source region on said third semiconductor layer of the first conductivity type, and removing said third semiconductor layer of the first conductivity type at an area other than said source region by etching so as to form and leave said source region remaining; and doping said second semiconductor layer of the first conductivity type on two sides of said source region with said impurity of the second conductivity type with a concentration that is higher than said impurity concentration C2 to form said confining region of the second conductivity type and said gate region of the second conductivity type as said at least one second SiC film having the second conductivity type in said second semiconductor layer.

8. The method of manufacturing a junction field effect transistor according to claim 7, wherein said doping of said impurity of the second conductivity type comprises ion implantation performed using the same mask used for etching of said third semiconductor layer of the first conductivity type.

9. The junction field effect transistor according to claim 1, wherein said source region is disposed on top of said one main surface of said semiconductor thin body, and said confining region is disposed within said semiconductor thin body extending below said one main surface thereof.

10. A junction field effect transistor, comprising:
a gate region of a second conductivity type provided on one main surface of a semiconductor thin body consisting of an SiC substrate;
a source region of a first conductivity type provided on said one main surface;
a channel region of the first conductivity type that adjoins said source region;
a confining region of the second conductivity type that adjoins said gate region and encloses and confines a range of said channel region;
a drain region of the first conductivity type provided on an other main surface of said semiconductor thin body;
a drift region of the first conductivity type that continuously lies in a direction of thickness of said semiconductor thin body from said channel region to said drain region;
a source electrode located on said source region; and
an interposed region of the second conductivity type that makes contact with said source electrode and extends to said channel region;
wherein:
a concentration of an impurity of the first conductivity type in said drift region and said channel region is lower than a concentration of an impurity of the first conductivity type in said source region and said drain region and lower than a concentration of an impurity of the second conductivity type in said confining region,
said source region said channel region, said drain region and said drift region are formed of at least one first SiC film having the first conductivity type, and
said gate region and said confining region are formed of at least one second SiC film having the second conductivity type.

11. The junction field effect transistor according to claim 10, wherein said interposed region is separated into at least two regions with a region of the first conductivity type sandwiched therebetween.

12. The junction field effect transistor according to claim 8, wherein said channel region includes a low impurity concentration portion of the first conductivity type and another portion within said channel region, said channel region is in contact with said confining region and said source region, and said low impurity concentration portion has an impurity concentration lower than a concentration of an impurity of the first conductivity type in said another portion of said channel region.

13. A junction field effect transistor, comprising:
a gate region of a second conductivity type provided on one main surface of a semiconductor thin body consisting of an SiC substrate;
a source region of a first conductivity type provided on said one main surface;
a channel region of the first conductivity type that adjoins said source region;
a confining region of the second conductivity type that adjoins said gate region and encloses and confines a range of said channel region;
a drain region of the first conductivity type provided on an other main surface of said semiconductor thin body; and
a drift region of the first conductivity type that continuously lies in a direction of thickness of said semiconductor thin body from said channel region to said drain region;
wherein:
a concentration of an impurity of the first conductivity type in said drift region and said channel region is lower than a concentration of an impurity of the first conductivity type in said source region and said drain region and lower than a concentration of an impurity of the second conductivity type in said confining region,
said source region, said channel region, said drain region and said drift region are formed of at least one first SiC film having the first conductivity type,
said gate region and said confining region are formed of at least one second SiC film having the second conductivity type,
said source region includes two source region portions and the channel region includes two channel region portions; and
further comprising a conductive film sandwiched between the two channel region portions in a position range that is lower than a top surface level of the channel region.

14. The junction field effect transistor according to claim 13, wherein said conductive film extends into said drift region.

15. The junction field effect transistor according to claim 13, wherein a channel region width from said confining region to said conductive film in said channel region is smaller than a depletion layer width in said channel region due to a built-in potential in a junction portion between said confining region and said channel region.

16. The junction field effect transistor according to claim 13, wherein said conductive film is a film selected from the group consisting of a metal film and a semiconductor film that includes an impurity of the first or second conductivity type at a high concentration to make said semiconductor film conductive.

17. The junction field effect transistor according to claim 13, wherein said conductive film is a conductive metal film.

18. A junction field effect transistor, comprising:
- a gate region of a second conductivity type provided on one main surface of a semiconductor thin body;
- a source region of a first conductivity type provided on said one main surface;
- a channel region of the first conductivity type that adjoins said source region;
- a confining region of the second conductivity type that adjoins said gate region and encloses and confines a range of said channel region;
- a drain region of the first conductivity type provided on an other main surface of said semiconductor thin body;
- a drift region of the first conductivity type that continuously lies in a direction of thickness of said semiconductor thin body from said channel region to said drain region;
- a source electrode located on said source region; and
- an interposed region of the second conductivity type that makes contact with said source electrode and that passes through said source region and stretches out to said channel region;
- wherein a concentration of an impurity of the first conductivity type in said drift region and said channel region is lower than a concentration of an impurity of the first conductivity type in said source region and said drain region and lower than a concentration of an impurity of the second conductivity type in said confining region.

19. A junction field effect transistor, comprising:
- a gate region of a second conductivity type provided on one main surface of a semiconductor thin body;
- a source region including two source region portions of a first conductivity type provided on said one main surface;
- a channel region including two channel region portions of the first conductivity type that adjoins said source region;
- a conductive film sandwiched between said two channel region portions in a position range that is lower than a top surface level of said channel region;
- a confining region of the second conductivity type that adjoins said gate region and encloses and confines a range of said channel region;
- a drain region of the first conductivity type provided on an other main surface of said semiconductor thin body; and
- a drift region of the first conductivity type that continuously lies in a direction of thickness of said semiconductor thin body from said channel region to said drain region;
- wherein a concentration of an impurity of the first conductivity type in said drift region and said channel region is lower than a concentration of an impurity of the first conductivity type in said source region and said drain region and lower than a concentration of an impurity of the second conductivity type in said confining region.

* * * * *

UNITED STATES PATENT AND TRADEMARK OFFICE
CERTIFICATE OF CORRECTION

PATENT NO. : 6,870,189 B1  Page 1 of 1
DATED : March 22, 2005
INVENTOR(S) : Harada et al.

It is certified that error appears in the above-identified patent and that said Letters Patent is hereby corrected as shown below:

Drawings,
Sheets 10 of 12, replace Fig. 22 as follows:

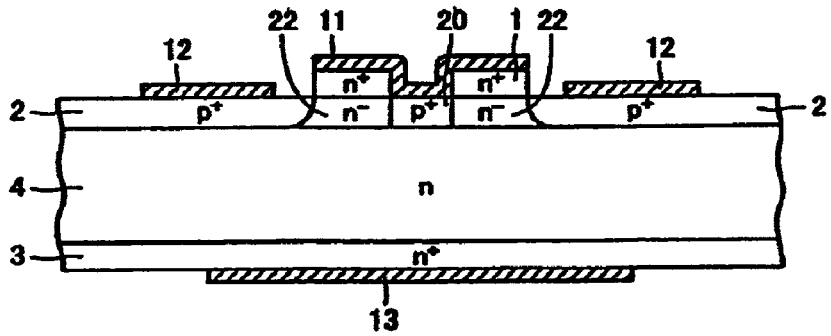

Column 6,
Line 32, after "concentration", replace "region, portion" by -- region or portion, --.

Column 11,
Line 28, after "In the", replace "off-state;" by -- off-state, --.

Signed and Sealed this

Sixteenth Day of August, 2005

JON W. DUDAS
Director of the United States Patent and Trademark Office

UNITED STATES PATENT AND TRADEMARK OFFICE
CERTIFICATE OF CORRECTION

PATENT NO. : 6,870,189 B1
DATED : March 22, 2005
INVENTOR(S) : Harada et al.

It is certified that error appears in the above-identified patent and that said Letters Patent is hereby corrected as shown below:

<u>Column 14,</u>
Line 39, following "low impurity" and before ".", insert:
-- concentration region with an extremely low reverse bias voltage. Thus, a depletion layer 21 as one shown in Fig. 23 can be formed with an extremely low reverse bias voltage, and the off-state can be achieved. As a result, it becomes possible to ensure an even lower loss as a bulk power switching device --.

Signed and Sealed this

Fourth Day of October , 2005

JON W. DUDAS
*Director of the United States Patent and Trademark Office*